(12) United States Patent
Mieczkowski et al.

(10) Patent No.: US 9,142,631 B2
(45) Date of Patent: Sep. 22, 2015

(54) MULTILAYER DIFFUSION BARRIERS FOR WIDE BANDGAP SCHOTTKY BARRIER DEVICES

(75) Inventors: Van Mieczkowski, Apex, NC (US); Helmut Hagleitner, Zebulon, NC (US); Zoltan Ring, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 721 days.

(21) Appl. No.: 12/725,812

(22) Filed: Mar. 17, 2010

(65) Prior Publication Data

US 2011/0227089 A1    Sep. 22, 2011

(51) Int. Cl.
| | | |
|---|---|---|
| H01L 27/095 | (2006.01) | |
| H01L 29/47 | (2006.01) | |
| H01L 29/423 | (2006.01) | |
| H01L 29/778 | (2006.01) | |
| H01L 29/20 | (2006.01) | |

(52) U.S. Cl.
CPC ........ H01L 29/475 (2013.01); H01L 29/42316 (2013.01); H01L 29/7787 (2013.01); H01L 29/2003 (2013.01)

(58) Field of Classification Search
CPC ...................... H01L 29/7786; H01L 21/28581
USPC .............. 257/76, E27.068, 77, 155, 260, 266, 257/267, 280, 281, 284, 449, 471, 476, 257/E31.074, E33.051, E51.009, 475, 478, 257/486
See application file for complete search history.

(56) References Cited

U.S. PATENT DOCUMENTS

| | | | |
|---|---|---|---|
| 4,796,069 A * | 1/1989 | Anantha et al. ............... | 257/484 |
| 5,471,077 A | 11/1995 | Sokolich | |
| 5,625,233 A | 4/1997 | Cabral, Jr. et al. | |
| 5,942,799 A | 8/1999 | Danek et al. | |
| 6,146,931 A | 11/2000 | Nunokawa et al. | |
| 6,320,265 B1 | 11/2001 | Chakrabarti et al. | |

(Continued)

FOREIGN PATENT DOCUMENTS

| | | |
|---|---|---|
| EP | 2 071 623 A2 | 6/2009 |
| JP | 4-373175 A | 12/1992 |

(Continued)

OTHER PUBLICATIONS

The International Search Report and the Written Opinion of the International Searching Authority, PCT Application No. PCT/US11/21045, May 9, 2011.

(Continued)

*Primary Examiner* — Samuel Gebremariam
(74) *Attorney, Agent, or Firm* — Myers Bigel Sibley & Sajovec, P.A.

(57) ABSTRACT

Semiconductor Schottky barrier devices include a wide bandgap semiconductor layer, a Schottky barrier metal layer on the wide bandgap semiconductor layer and forming a Schottky junction, a current spreading layer on the Schottky barrier metal layer remote from the wide bandgap semiconductor layer and two or more diffusion barrier layers between the current spreading layer and the Schottky barrier metal layer. The first diffusion barrier layer reduces mixing of the current spreading layer and the second diffusion barrier layer at temperatures of the Schottky junction above about 300° C. and the second diffusion barrier layer reduces mixing of the first diffusion barrier layer and the Schottky barrier metal layer at the temperatures of the Schottky junction above about 300° C.

8 Claims, 4 Drawing Sheets

(56) References Cited

U.S. PATENT DOCUMENTS

| | | | |
|---|---|---|---|
| 6,787,910 B2 | 9/2004 | Lee et al. | |
| 6,818,319 B2 | 11/2004 | Tsao et al. | |
| 7,122,841 B2 * | 10/2006 | Oh et al. | 257/81 |
| 7,154,178 B2 | 12/2006 | Lin | |
| 9,024,327 B2 * | 5/2015 | Ward et al. | 257/77 |
| 2003/0107101 A1 | 6/2003 | Nishii et al. | |
| 2005/0151255 A1 | 7/2005 | Ando et al. | |
| 2006/0081897 A1 * | 4/2006 | Yoshida | 257/289 |
| 2006/0157735 A1 | 7/2006 | Kanamura et al. | |
| 2006/0244009 A1 | 11/2006 | Choug et al. | |
| 2007/0108547 A1 | 5/2007 | Zhu et al. | |
| 2008/0106926 A1 * | 5/2008 | Brubaker et al. | 365/148 |
| 2008/0224183 A1 | 9/2008 | Nawaz | |

FOREIGN PATENT DOCUMENTS

| | | |
|---|---|---|
| JP | 8-191055 A | 7/1996 |
| JP | 10-177967 A | 6/1998 |
| JP | 2002-353163 A | 12/2002 |
| JP | 2004-22773 A | 1/2004 |
| JP | 2005-327890 A | 11/2005 |

OTHER PUBLICATIONS

Communication with Supplementary European Search Report, EP Application No. 11756677.8, Jul. 14, 2014.

Kimura et al., "Electron Irradiation During Schottky Gate Metal Evaporation and Its Effect on the Stability of InGaAs/AlGaAs HEMTs", *Solid-State Electronics*, vol. 41, No. 10, pp. 1457-1461, Oct. 1, 1997.

Würfl et al., "Technology towards GaAs MESFET-based IC for high temperature applications", *Materials Science and Engineering: B*, vol. 46, Issues 1-3, Apr. 1997, pp. 52-56.

Notification of Rejection and English translation, Japanese Patent Application No. 2013-500048, Mar. 3, 2014.

* cited by examiner

MULTILAYER DIFFUSION BARRIERS FOR WIDE BANDGAP SCHOTTKY BARRIER DEVICES

STATEMENT REGARDING FEDERALLY SPONSORED RESEARCH OR DEVELOPMENT

This invention was developed under government Contract No. 05-D-6000, awarded by GaN MMIC Development, Department of the Navy. The U.S. Government has certain rights in this invention.

BACKGROUND OF THE INVENTION

This invention relates to semiconductor devices and, more particularly, to Schottky barrier devices.

Schottky barrier devices are widely used in many consumer, commercial and other applications. A Schottky barrier is a potential barrier formed at a metal-semiconductor junction, which has rectifying characteristics. Many Schottky barrier devices use wide bandgap semiconductors, such as silicon carbide, gallium nitride and/or gallium arsenide, which may be used for high power, high temperature and/or microwave applications. Semiconductor Schottky barrier devices include Schottky diodes, High Electron Mobility Transistors (HEMTs) and MEtal Semiconductor Field Effect Transistors (MESFETs). A HEMT is a field effect transistor that incorporates a junction between two materials with different bandgaps (i.e., a heterojunction) as the channel, instead of a doped region, as is generally the case in integrated circuit field effect transistors. A Schottky barrier gate is used to control a two-dimensional electron gas (2DEG) between a source region and a drain region. In a MESFET, a Schottky barrier gate is used to control conduction in a channel that is formed between source and drain regions.

A wide bandgap Schottky barrier device generally includes a wide bandgap semiconductor layer and a Schottky barrier metal layer on the wide bandgap semiconductor layer that forms a Schottky junction therewith. A current spreading layer is also provided on the Schottky barrier metal layer remote from the wide bandgap semiconductor layer. In order to reduce or prevent undesired mixing between the Schottky barrier metal layer and the current spreading layer, a diffusion barrier is often provided between the Schottky barrier metal layer and the current spreading layer. Thus, for example, in a gallium nitride-based device, the Schottky barrier metal layer may comprise nickel, the current spreading layer may comprise gold, and the diffusion barrier may comprise platinum.

SUMMARY OF THE INVENTION

Semiconductor Schottky barrier devices according to various embodiments described herein include a wide bandgap semiconductor layer, a Schottky barrier metal layer on the wide bandgap semiconductor layer and forming a Schottky junction therewith, a current spreading layer on the Schottky barrier metal layer remote from the wide bandgap semiconductor layer and two or more diffusion barrier layers between the current spreading layer and the Schottky barrier metal layer. In some embodiments, a first diffusion barrier layer is provided between the current spreading layer and the Schottky barrier metal layer and a second diffusion barrier layer is provided between the first diffusion barrier layer and the Schottky barrier metal layer.

In some embodiments, the first diffusion barrier layer is configured to reduce mixing of the current spreading layer and the second diffusion barrier layer at temperatures of the Schottky junction above about 300° C. and the second diffusion barrier layer is configured to reduce mixing of the first diffusion barrier layer and the Schottky barrier metal layer at the temperatures of the Schottky junction above about 300° C. Moreover, in some embodiments, the Schottky barrier metal layer is directly on the wide bandgap semiconductor layer, the second diffusion layer is directly on the Schottky barrier metal layer, the first diffusion barrier layer is directly on the second diffusion barrier layer and the current spreading layer is directly on the first diffusion barrier layer.

As to materials, in some embodiments, the wide bandgap semiconductor layer comprises gallium nitride, the Schottky barrier metal layer comprises nickel, the current spreading layer comprises gold, the first diffusion barrier layer comprises platinum, and the second diffusion barrier layer comprises tantalum. In other embodiments, the wide bandgap semiconductor layer comprises gallium nitride and/or silicon carbide, the Schottky barrier metal layer comprises nickel, platinum and/or iridium, the current spreading layer comprises gold and/or copper, the first diffusion barrier layer comprises platinum, molybdenum, tungsten and/or chromium, and the second diffusion barrier layer comprises tantalum and/or tungsten, and is different form the first diffusion barrier layer.

More than two diffusion barrier layers may be provided according to other embodiments. For example, in some embodiments, a plurality of alternating ones of the first and second diffusion barrier layers may be provided between the Schottky barrier metal layer and the current spreading layer. In other embodiments, an adhesion layer may be provided between the first and second diffusion barrier layers. The adhesion layer may comprise titanium, chromium and/or other metals with good adhesion characteristics. In still other embodiments, a third diffusion barrier layer may be provided between the first and second diffusion barrier layers. The third diffusion barrier layer may comprise titanium.

Multilayer diffusion barrier layers according to various embodiments described herein may be used in various wide bandgap semiconductor Schottky barrier devices. For example, they may be used with a Schottky diode. In other embodiments, source and drain regions may be provided, a respective one of which is adjacent an opposing end of the Schottky barrier metal layer and configured to provide a HEMT or a MESFET.

Viewed from a materials standpoint, semiconductor Schottky barrier devices according to various embodiments described herein include a first layer comprising gallium nitride, a second layer comprising nickel on the first layer, a third layer comprising tantalum on the second layer and remote from the first layer, a fourth layer comprising platinum on the third layer and remote from the second layer, and a fifth layer comprising gold on the fourth layer and remote from the third layer. Other material combinations as described herein may be provided.

Various embodiments described herein may also be regarded as providing a diffusion barrier comprising at least one layer between the current spreading layer and the Schottky barrier metal layer and configured to prevent a substantial increase in leakage current of the Schottky junction at temperatures of the Schottky junction above about 300° C. Various diffusion barrier layers as described herein may be used.

DETAILED DESCRIPTION

Figure 1:
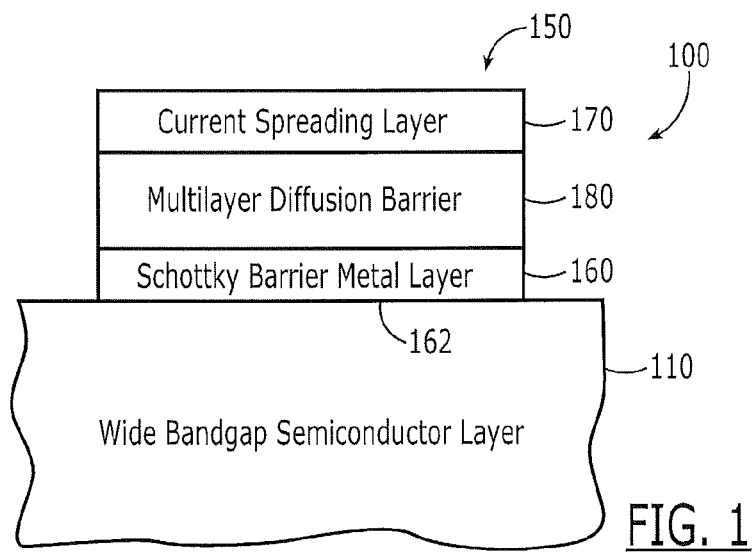
FIGS. 1-8 are cross-sectional views of semiconductor Schottky barrier devices according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises", "comprising", "includes" and/or "including" (and variants thereof), when used in this specification, specify the presence of stated features, steps, operations, elements, and/or components, but do not preclude the presence or addition of one or more other features, steps, operations, elements, components, and/or groups thereof. For example, when a layer is indicated as "comprising" a given material, the layer may include additional materials to form binary, ternary, quaternary etc., compounds, alloys, doped layers, etc. Thus, for example, a layer that comprises gallium nitride includes a layer of aluminum gallium nitride, indium gallium nitride and/or aluminum indium gallium nitride. In contrast, the term "consisting of" (and variants thereof) when used in this specification, specifies the stated features, steps, operations, elements, and/or components, and precludes additional features, steps, operations, elements and/or components. Finally, all of the above defined terms do not preclude the layer from being doped P-type and/or N-type using, for example, P-type dopants such as magnesium and/or N-type dopants such as silicon.

It will be understood that when an element such as a layer, region or substrate is referred to as being "on" another element (and variants thereof), it can be directly on the other element or intervening elements may also be present. Furthermore, relative terms such as "beneath", "overlies", "topside" and "backside" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of semiconductor Schottky barrier devices will be described herein. As used herein, the term "semiconductor Schottky barrier device" may include a Schottky diode, HEMT, MESFET and/or other semiconductor Schottky barrier device that includes one or more semiconductor layers, which may include silicon, silicon carbide, gallium nitride and/or other semiconductor materials. A semiconductor Schottky barrier device may or may not include a substrate such as a sapphire, silicon, silicon carbide, aluminum nitride and/or other microelectronic substrate(s).

Figure 2:
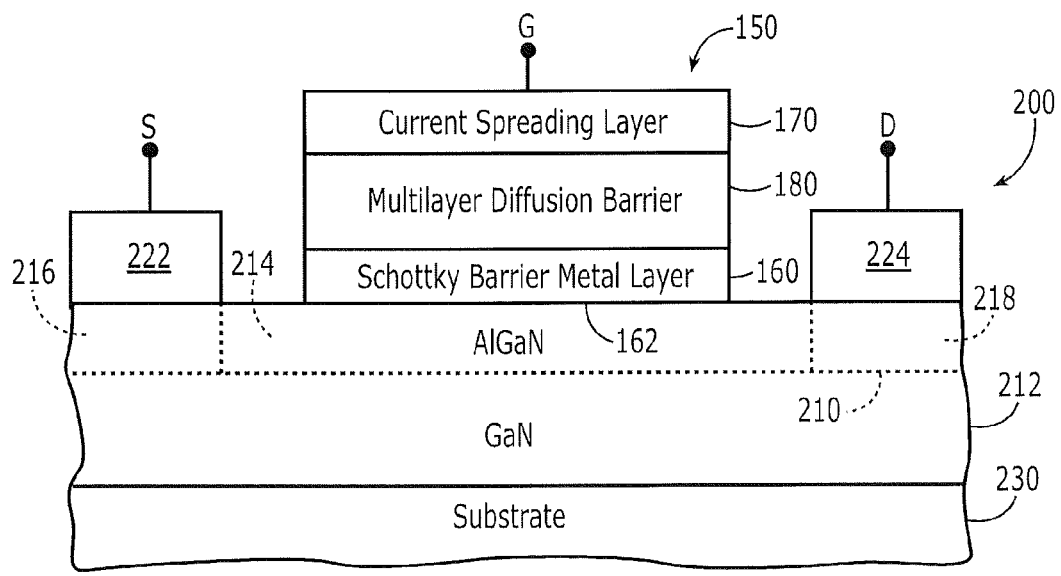
Figure 3:
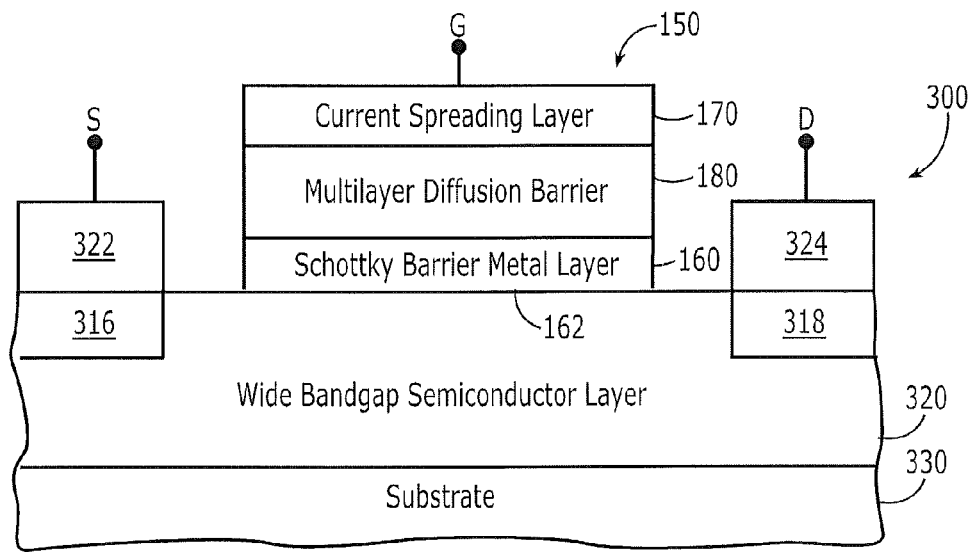

FIGS. 1, 2 and 3 are simplified cross-sectional views of wide bandgap Schottky barrier devices including a Schottky diode (FIG. 1), a HEMT (FIG. 2) and a MESFET (FIG. 3), including a multilayer diffusion barrier according to various embodiments described herein. FIG. 1 may also provide a general representation of a semiconductor Schottky barrier device according to various embodiments described herein.

Referring now to FIG. 1, a semiconductor Schottky barrier device/Schottky diode 100 includes a wide bandgap semiconductor layer 110 that may comprise, for example, material(s) having bandgap of at least about 1.7 eV, such as silicon carbide and/or gallium nitride. The wide bandgap semiconductor layer 110 may be freestanding, may comprise a portion of a substrate or may itself be on a substrate. Various buffer layers and/or other layers may also be provided. An ohmic contact for the wide bandgap semiconductor layer 110 also may be provided.

Referring to FIG. 2, a HEMT 200 may include a heterojunction 210 between two different wide bandgap materials 212 and 214 having different bandgaps. In FIG. 2, the two different materials 212 and 214 comprise GaN and AlGaN, respectively, but other materials may be used in other embodiments. A source region 216 and a drain region 218 may be provided. Source and drain contacts 222 and 224, respectively, may also be provided. A substrate 230 also may be provided. Various other buffer, spacer, capping and/or other layers may be provided.

FIG. 3 illustrates a MESFET that includes a substrate 330, such as a silicon carbide substrate, and a wide bandgap semiconductor layer or layers 320 thereon that may comprise gallium nitride. A source 316, a drain 318, a source contact 322 and a drain contact 324 may also be provided. Various other buffer, capping, insulating and/or other layers may also be provided. It will also be understood that FIG. 1 illustrates a vertical embodiment of a Schottky barrier diode, and FIGS. 2 and 3 illustrate lateral embodiments of a HEMT 200 and a MESFET 300, respectively. In other embodiments, however, lateral Schottky barrier diodes may be provided and vertical HEMTs and MESFETs may be provided.

Referring again to FIGS. 1, 2 and 3, each of the devices 100, 200 and 300 includes a multilayer diffusion barrier Schottky contact 150. The multilayer diffusion barrier Schottky contact 150 may form an anode metal stack in the Schottky diode 100, and a gate in the HEMT 200 or MESFET 300.

These Schottky barrier contacts 150 each include a Schottky barrier metal layer 160 on the wide bandgap semiconductor layer 110, 214 and/or 320 that forms a Schottky junction 162 therewith. A current spreading layer 170 is provided on the Schottky barrier metal layer 160, remote from the wide bandgap semiconductor layer 110, 214 or 320. A diffusion barrier comprising at least two layers, also referred to herein as a "multilayer diffusion barrier" 180 is provided between the current spreading layer 170 and the Schottky barrier metal layer 160. In some embodiments, the multilayer diffusion barrier 180 is configured to prevent a substantial increase in leakage current of the Schottky junction 162 at temperatures of the Schottky junction 162 above about 300° C. Various embodiments of multilayer diffusion barriers 180 will be described below. However, a general discussion of multilayer diffusion barriers according to various embodiments described herein will first be provided.

In particular, Schottky barrier contacts, such as are used in GaN-based HEMT gates, typically include three metal layers: a Schottky barrier in contact with the wide bandgap semiconductor, a current spreading layer, and a diffusion barrier layer therebetween to reduce or prevent diffusion of the current spreading layer into the Schottky barrier metal layer. Nickel is the most commonly used Schottky barrier metal layer for GaN-based HEMTs. The current spreading layer is typically gold and the diffusion barrier is typically platinum. The gold current spreading layer serves to enhance the conductivity of the gate and to lower gate resistance. The platinum diffusion barrier is used as a barrier for gold diffusion, which, if allowed to reach the semiconductor surface, may create a degraded Schottky contact because of diffusion problems.

It has been found, according to various embodiments herein, that a Schottky contact with a single nickel diffusion barrier layer can degrade and become leaky in reverse bias. Leakage increases of several orders of magnitude, for example a hundredfold increase, during operation at elevated temperatures (i.e., above about 300° C.) are not uncommon. Without wishing to be bound by any theory of operation, it is theorized that there is migration of other metals, such as platinum or gold, into the Schottky barrier metal layer. More specifically, metal mixing at temperatures above 300° C. may take place. Thus, the nickel Schottky barrier metal layer mixes with the platinum diffusion barrier layer, which attracts hydrogen and then poisons the semiconductor. The gold current spreading layer then mixes with the new nickel-platinum amalgam, which then diffuses into the wide bandgap semiconductor layer at temperatures over about 300° C. Although platinum is a good barrier to gold, titanium and other commonly used metals in the semiconductor industry, it is a poor barrier to nickel diffusion. Moreover, other barriers to gold diffusion can be used, such as molybdenum, palladium and tungsten, but they all may have compromises related to diffusion between the Schottky barrier layer and the current spreading layer.

In order to reduce or prevent this undesirable diffusion, various embodiments described herein provide a multilayer diffusion barrier, where the individual diffusion barriers can be tailored to reduce or minimize diffusion between layers adjacent to one another. The multilayer diffusion barrier can include two, three, four, etc., layers.

Figure 4:
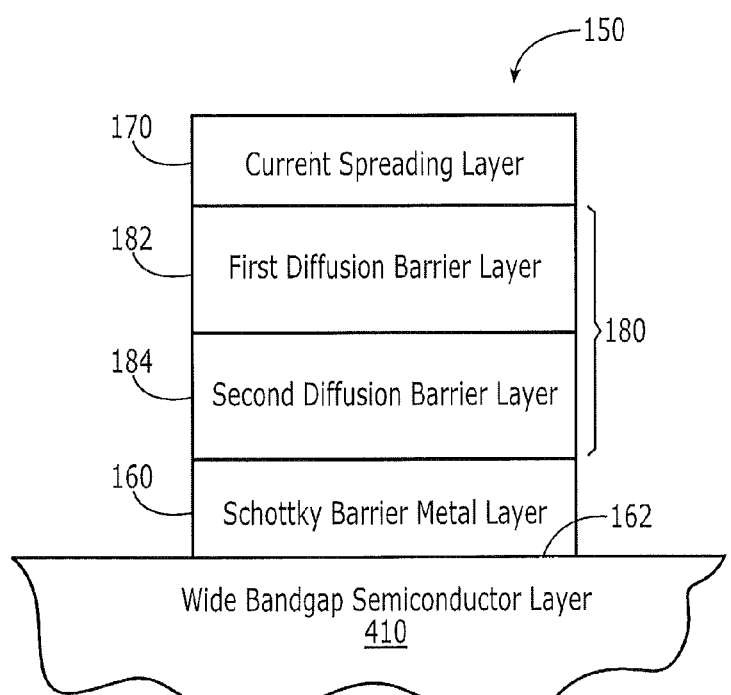

FIG. 4 illustrates a wide bandgap Schottky barrier device including a multilayer diffusion barrier 180 according to various embodiments. A Schottky barrier metal layer 160 provides a Schottky junction 162 with the wide bandgap semiconductor layer 410, which may be the wide bandgap semiconductor layer 110 of a Schottky diode, the wide bandgap semiconductor layer 214 of a HEMT, or the wide bandgap semiconductor layer 320 of a MESFET. A current spreading layer 170 is provided on the Schottky barrier metal layer 160 remote from the wide bandgap semiconductor layer 410. A first diffusion barrier layer 182 is provided between the current spreading layer 170 and the Schottky barrier metal layer 160. A second diffusion barrier layer 184 is provided between the first diffusion barrier layer 182 and the Schottky barrier metal layer 160.

In some embodiments, each diffusion barrier layer 182, 184 is designed to reduce or minimize diffusion between the layers adjacent thereto. In particular, the first diffusion barrier layer 182 may be configured to reduce mixing of the current spreading layer 170 and the second diffusion barrier layer 184 at temperatures of the Schottky junction 162 above about 300° C. The second diffusion barrier layer 184 may be configured to reduce mixing of the first diffusion barrier layer 182 and the Schottky barrier metal layer 160 at the temperatures of the Schottky junction 162 above about 300° C. In some embodiments, as illustrated in FIG. 4, the Schottky barrier metal layer 160 is directly on the wide bandgap semiconductor layer 410, the second diffusion barrier layer 184 is directly on the Schottky barrier metal layer 160, the first diffusion barrier layer 182 is directly on a second diffusion barrier layer 184, and the current spreading layer 170 is directly on the first diffusion barrier layer 182. However, in other embodiments, additional layers may be provided, as will be described below. For example, the first and/or second diffusion barrier layers 182 and/or 184 may be replicated, a third diffusion barrier layer may be provided and/or adhesion layer(s) may be provided.

Figure 5:
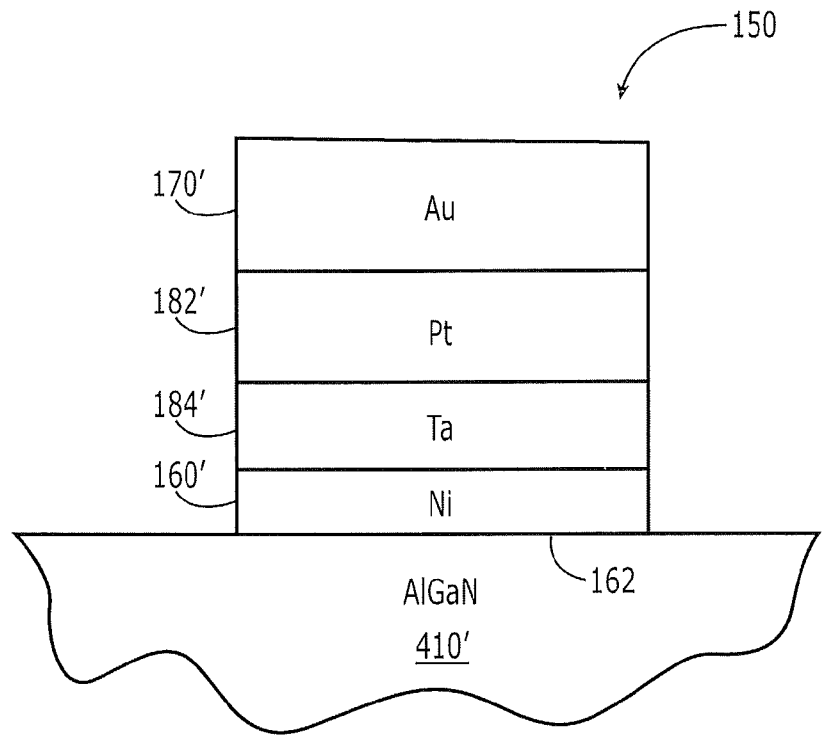

FIG. 5 illustrates an example embodiment of a Schottky contact structure 150 according to various embodiments of FIG. 4. Referring to FIG. 5, the wide bandgap semiconductor layer 410' may comprise aluminum gallium nitride (AlGaN). The Schottky barrier metal layer 160' may comprise nickel (Ni), the first diffusion barrier layer 182' may comprise platinum (Pt), the second diffusion barrier layer 184' may comprise tantalum (Ta) and the current spreading layer 170' may comprise gold. Thus, the tantalum layer 184' acts as a diffusion barrier to Ni/Pt mixing and the platinum layer 182' acts as a diffusion barrier to Au/Ta mixing. In some embodiments, the nickel layer 160' may be between about 10 Å and about 1,000 Å thick and, in some embodiments, may be about 150 Å thick. The tantalum layer 184' and the platinum layer 182' may each be between about 100 Å and about 2,000 Å thick and, in some embodiments, may each be about 200 Å thick. The gold layer 170' may be between about 3,000 Å and about 10,000 Å thick and, in some embodiments, may be about 6,000 Å thick. The layers 160', 184', 182' and 170' may be fabricated using evaporation and/or other conventional deposition processes.

Figure 6:
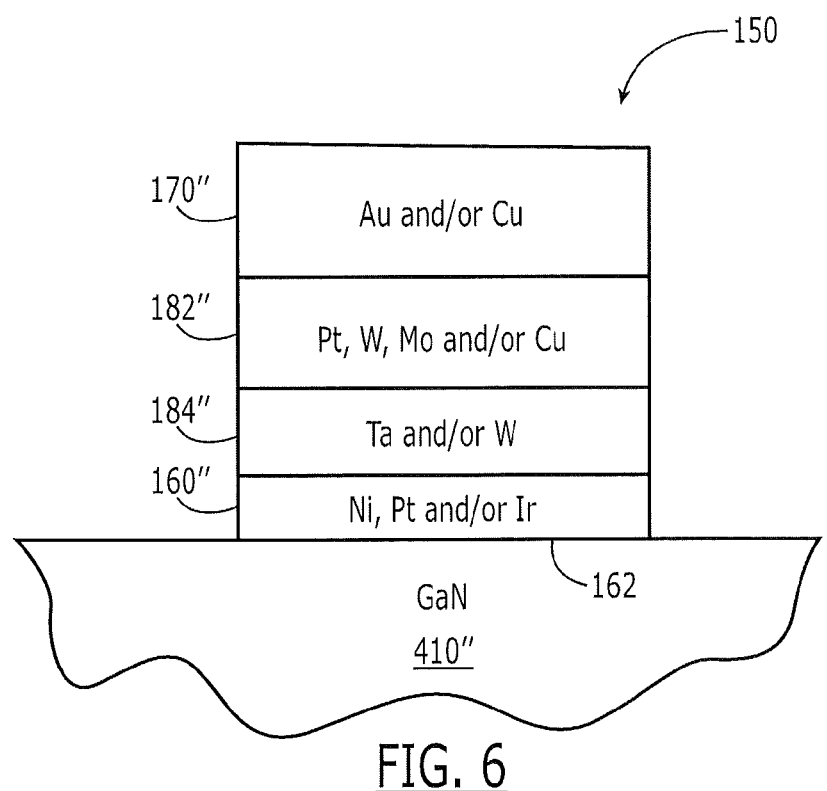

FIG. 6 illustrates various other embodiments including materials that may used for the various layers. In particular, the Schottky barrier metal layer 160" may comprise nickel (Ni), platinum (Pt) and/or iridium (Ir). The second diffusion barrier 184" may comprise tantalum (Ta) and/or tungsten (W). The first diffusion barrier layer 182" may comprise platinum (Pt), tungsten (W), molybdenum (Mo) and/or chromium (Cr), where the first and second diffusion barrier layers 182" and 184" are different from one another. Finally, the current spreading layer 170" may comprise gold (Au) and/or copper (Cu). Specific embodiments of FIG. 6 may include a stack of Ni 160", Ta 184", W 182" and Cu 170", or a stack of Ni 160", Ta 184", Mo 182" and Au 170". Accordingly, by using two or more metal layers as diffusion barriers, the reliability of the device may be improved by tailoring the barrier requirements to the neighboring metals.

Figure 7:
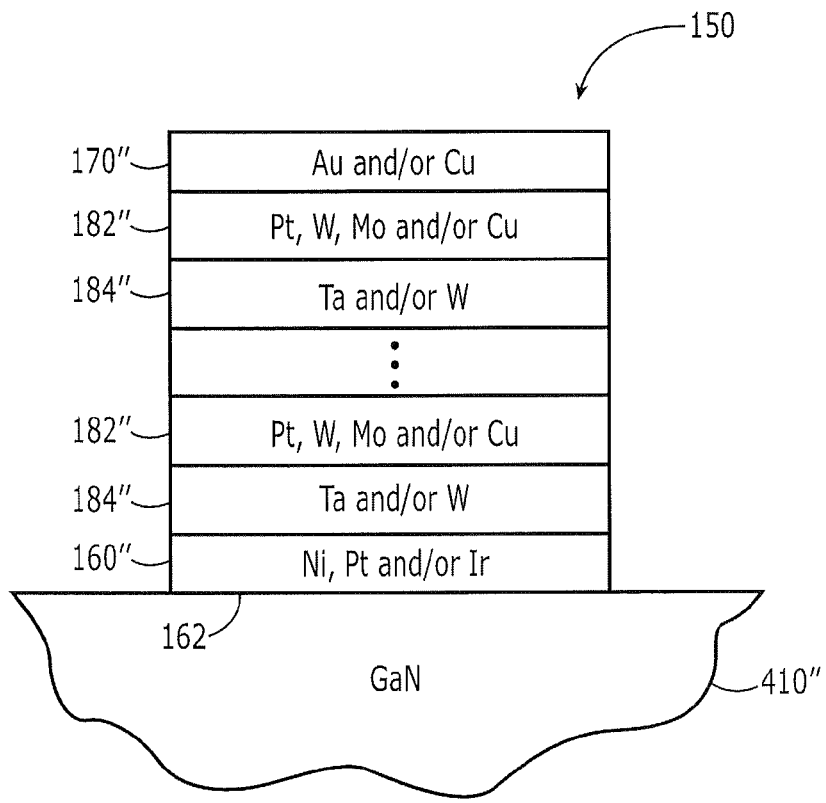

As was described above, more than two diffusion barrier layers may be provided according to other embodiments. For example, FIG. 7 illustrates a plurality of alternating first and second diffusion barrier layers 182", 184" between the Schottky barrier metal layer 160" and the current spreading layer 170". When such alternating layers are provided, the total thickness of the plurality of the first or second diffusion barrier layers may be between about 100 Å and about 2,000 Å and, in some embodiments, may be about 200 Å. Stated differently, when the multiple diffusion barrier layers are replicated, the individual thickness of the diffusion barrier layers may be reduced. By replicating the first and second diffusion barrier layers, reduced grain boundary defects may be provided in the contact stack, by disrupting the grain boundaries.

Figure 8:
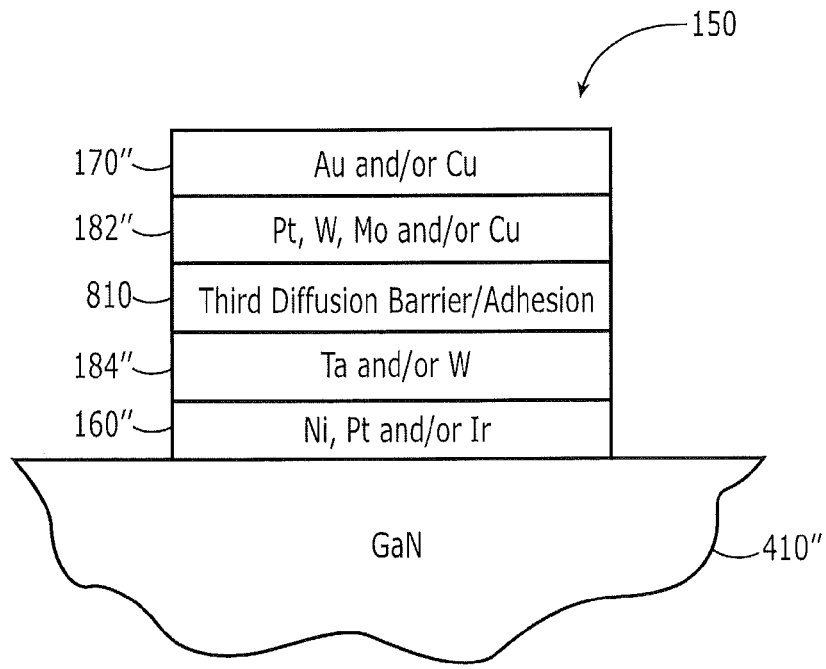

FIG. 8 illustrates other embodiments where a third diffusion barrier layer and/or an adhesion layer 810 may be provided between the first diffusion barrier layer 182" and the second diffusion barrier layer 184". The third diffusion barrier layer 810 may comprise titanium, such as metallic titanium or a thin layer of titanium oxide and/or titanium nitride. An adhesion layer may comprise titanium, chromium and/or other metals with good adhesion characteristics. Additional diffusion barrier layers and/or adhesion layers may also be provided at various other locations in various other embodiments.

Various embodiments described herein may prevent a substantial increase in leakage current of a Schottky barrier device at high junction temperatures. For example, a single diffusion barrier layer contact stack may include a Schottky barrier metal layer of 150 Å of nickel, a diffusion barrier layer of 200 Å of platinum and current spreading layer of 6,000 Å of gold. A multilayer diffusion barrier may add 200 Å of tantalum between the nickel Schottky barrier metal layer and the platinum first diffusion barrier, in a configuration illustrated in FIG. 5, with all of the other device parameters being unchanged. At junction temperatures above about 300° C., the leakage current of the single diffusion barrier layer contact stack may increase a hundredfold. Yet, little or no increase in leakage current may take place at temperatures above 300° C. in the multilayer diffusion barrier contact stack. Accordingly, a substantial increase in leakage current at junction temperatures above about 300° C. may be prevented by various embodiments described herein. High reliability, high temperature devices may thereby be provided.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor Schottky barrier device comprising:
 a wide bandgap semiconductor layer comprising gallium nitride;
 a Schottky barrier metal layer on the wide bandgap semiconductor layer comprising gallium nitride and forming a Schottky junction therewith;
 a current spreading layer on the Schottky barrier metal layer remote from the wide bandgap semiconductor layer;
 a first diffusion barrier layer between the current spreading layer and the Schottky barrier metal layer; and
 a second diffusion barrier layer between the first diffusion barrier layer and the Schottky barrier metal layer;
 a third diffusion barrier layer between the second diffusion barrier layer and the Schottky barrier metal layer; and
 a fourth diffusion barrier layer between the third diffusion barrier layer and the Schottky barrier metal layer;
 wherein the second and fourth diffusion barrier layers comprise tantalum and/or tungsten, and
 wherein the Schottky barrier metal layer is directly on the wide bandgap semiconductor layer, the fourth diffusion barrier layer is directly on the Schottky barrier metal layer, the third diffusion barrier layer is directly on the fourth diffusion barrier layer, the second diffusion barrier layer is directly on the third diffusion barrier layer and the first diffusion barrier layer is directly on the second diffusion barrier layer.

2. A device according to claim 1 wherein the first and third diffusion barrier layers comprise platinum.

3. A device according to claim 1 wherein the current spreading layer is directly on the first diffusion barrier layer.

4. A device according to claim 1 wherein the Schottky barrier metal layer comprises nickel, platinum and/or iridium, the current spreading layer comprises gold and/or copper, the first and third diffusion barrier layers comprise platinum, molybdenum, tungsten and/or chromium and the second and fourth diffusion barrier layers comprise tantalum and/or tungsten different from the first and third diffusion barrier layers.

5. A device according to claim 1 further comprising source and drain regions, a respective one of which is adjacent an opposing end of the Schottky barrier metal layer and configured to provide a HEMT or a MESFET.

6. A semiconductor Schottky barrier device comprising:
 a first layer comprising gallium nitride;
 a second layer comprising nickel directly on the first layer;
 a third layer comprising tantalum and/or tungsten directly on the second layer, remote from the first layer;
 a fourth layer comprising platinum directly on the third layer, remote from the second layer;
 a fifth layer comprising tantalum and/or tungsten directly on the fourth layer, remote from the third layer;
 a sixth layer comprising platinum directly on the fifth layer, remote from the fourth layer; and
 a seventh layer comprising gold on the sixth layer, remote from the fifth layer.

7. A device according to claim 6 wherein the seventh layer is directly on the sixth layer.

8. A device according to claim 6 further comprising source and drain regions, a respective one of which is adjacent an opposing end of the second layer and configured to provide a HEMT or a MESFET.

* * * * *